United States Patent [19]

Cauge et al.

[11] 3,845,495

[45] Oct. 29, 1974

[54] HIGH VOLTAGE, HIGH FREQUENCY DOUBLE DIFFUSED METAL OXIDE SEMICONDUCTOR DEVICE

[75] Inventors: Thomas P. Cauge; Joseph Kocsis, both of Mountain View, Calif.

[73] Assignee: Signetics Corporation, Sunnyvale, Calif.

[22] Filed: Oct. 12, 1973

[21] Appl. No.: 406,003

Related U.S. Application Data

[63] Continuation of Ser. No. 183,271, Sept. 23, 1971, abandoned.

[52] U.S. Cl. ........................ 357/23, 357/49, 357/53

[51] Int. Cl. ........................ H01l 11/00, H01l 15/00

[58] Field of Search ...... 317/235, 21.1, 22.2, 22.11, 317/46.1; 29/571

[56] References Cited

UNITED STATES PATENTS

| | | | |
|---|---|---|---|
| 3,405,329 | 10/1968 | Loro et al. | 317/235 |
| 3,411,051 | 11/1968 | Kilby | 317/235 |
| 3,456,168 | 7/1969 | Tatom | 317/235 |
| 3,461,360 | 8/1969 | Barson et al. | 317/235 |
| 3,513,364 | 5/1970 | Heiman | 317/235 |
| 3,631,312 | 12/1971 | Moyle | 317/235 |
| 3,660,732 | 5/1972 | Allison | 317/234 R |
| 3,711,940 | 1/1973 | Allison et al. | 29/571 |

*Primary Examiner*—Andrew J. James
*Attorney, Agent, or Firm*—Flehr, Hohbach, Test, Albritton & Herbert

[57] ABSTRACT

High voltage, high frequency metal oxide semiconductor device having a precisely controlled channel extending to the surface and in which a metallization overlies a thick insulating layer and substantially covers the depletion region in the drain for breakdown voltage control.

In the method, a double diffusion is carried out through the same opening in an oxide or insulating layer to obtain a very narrow precise channel region with a minimum of spreading and, in addition, metallization is formed which covers the depletion region.

12 Claims, 18 Drawing Figures

3,845,495

INVENTORS
Tom P. Cauge
Joseph Kocsis
BY Flehr, Hohbach, Test, Albritton & Herbert
Attorneys INVENTORS
Tom P. Cauge
Joseph Kocsis
BY Flehr, Hohbach, Test, Albritton & Herbert
Attorneys INVENTORS
Tom P. Cauge
Joseph Kocsis
BY Flehr, Hohbach, Test, Albritton & Herbert
Attorneys

HIGH VOLTAGE, HIGH FREQUENCY DOUBLE DIFFUSED METAL OXIDE SEMICONDUCTOR DEVICE

This is a continuation, of application Ser. No. 183,271 filed Sept. 23, 1971 and now abandoned.

BACKGROUND OF THE INVENTION

Metal oxide silicon transistors, conventionally called MOST, have heretofore been available. However, the power handling capability of such transistors has been quite low. This has been true because with conventional designs, high voltage and high frequency often present conflicting requirements on channel geometry. For high voltage, a wide channel is required to accommodate the large depletion width. For high frequencies, a very narrow channel width is desired. Prior attempts to overcome these difficulties have not been successful. There is, therefore, a need for a new and improved high frequency, high voltage metal oxide transistor.

SUMMARY OF THE INVENTION AND OBJECTS

The metal insulator semiconductor transistor consists of a semiconductor body having a planar surface. A precisely controlled diffused channel is formed in the body and has portions thereof extending to the surface. An insulating layer is formed on the surface. The insulating layer is relatively thin where it overlies the region in which the channel extends to the surface and is relatively thick throughout the remaining portions. Metallization is provided which extends through the insulating layer and makes contact with the source and drain regions for forming source and drain contacts. Metallization is disposed on said insulating layer where it is relatively thin to form a gate contact. Additional metallization is disposed on the insulating layer adjacent the gate metallization and extends outwardly towards the drain metallization so that it overlies substantially all of the depletion region in the drain region. In certain embodiments, the gate metallization and the additional metallization are interconnected.

In the method, the diffusion for the source region is carried out through the same window through which the channel region is diffused, and thereafter metallization is provided which covers the depletion region.

In general, it is an object of the present invention to provide a metal insulator semiconductor device which has a very high breakdown voltage.

Another object of the invention is to provide a device of the above character in which the depletion spread is not in the channel but in the drain region.

Another object of the invention is to provide a device of the above character which has a precisely formed channel that extends to the surface.

Another object of the invention is to provide a device of the above character which has a high voltage capability independent of the channel length.

Another object of the invention is to provide a device of the above character in which it is possible to easily make a "substrate" connection, i.e., a connection to a non-conducting portion of the channel.

Additional objects and features of the invention will appear from the following description in which the preferred embodiments are set forth in detail in conjunction with the accompanying drawings.

DESCRIPTION OF THE PREFERRED EMBODIMENTS

Figures 1, 2, 3, 4, 5, 6, 7, 8:
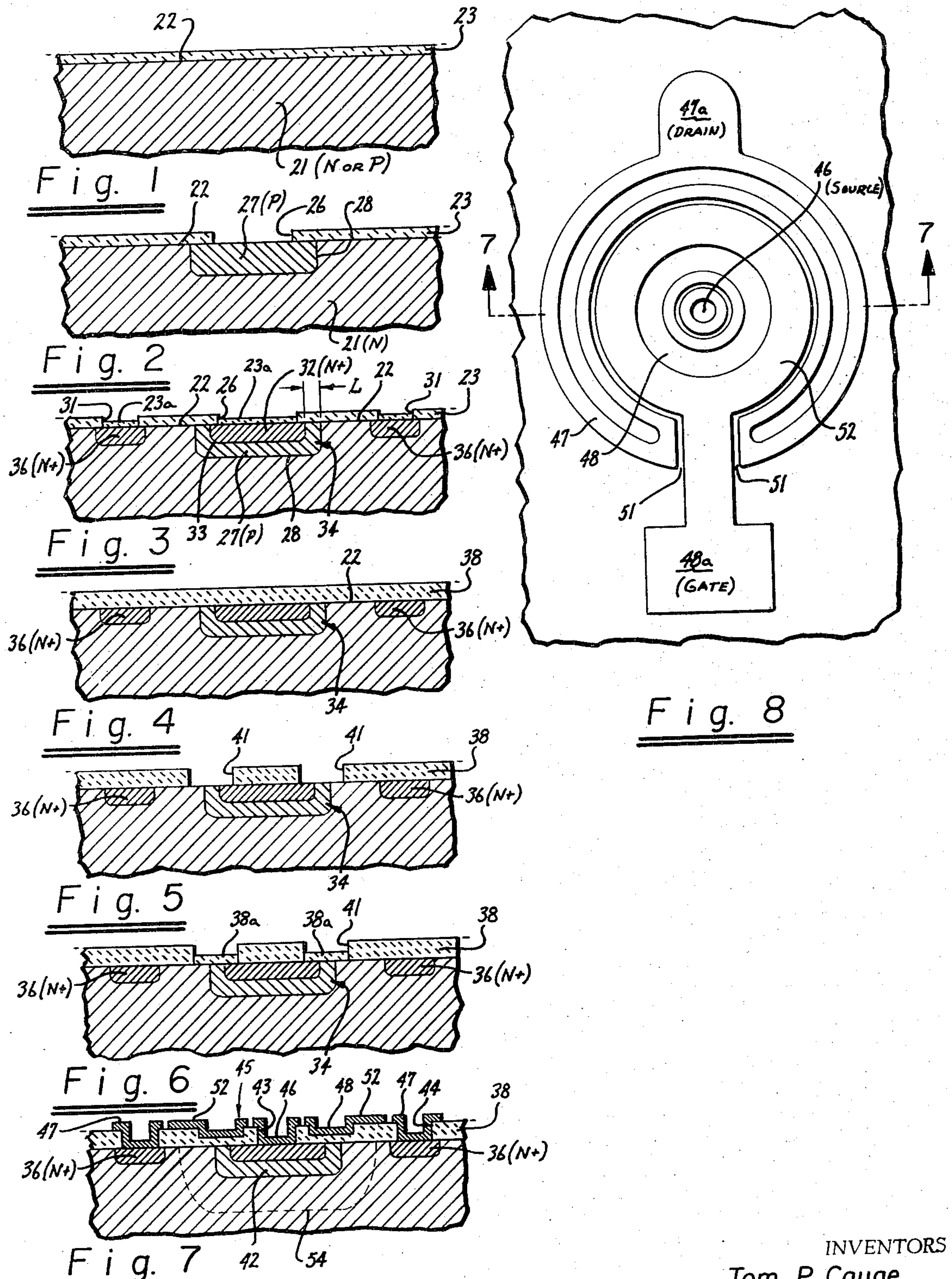
FIGS. 1 – 6 are partial cross-sectional views showing the method utilized for constructing a metal insulator semiconductor transistor incorporating the present invention.
FIG. 7 is a partial cross-sectional view of a completed metal insulator semiconductor transistor incorporating the present invention constructed in accordance with the steps set forth in FIGS. 1 – 6.
FIG. 8 is a partial top plan view of the construction shown in FIG. 7.

The starting material for making the metal insulator semiconductor transistor is shown in FIG. 1 and consists of a body 21 formed of a suitable semiconductor material such as silicon and in which at least a portion thereof which is to serve as a drain region has been doped with a first N or P-type impurity to provide a high resistivity N or P-type semiconductor body 21. The semiconductor body 21 is provided with a substantially planar surface 22 upon which there is disposed a thick insulating layer 23 formed of a suitable material such as silicon dioxide. Typical resistivity values for the semiconductor body 21 can range from a few ohm centimeters to 30 – 50 ohm cm. depending upon the breakdown potential desired for the device which is to be fabricated ranging from 100 volts to 1,000 volts.

The first actual step of fabrication of the transistor is shown in FIG. 2 in which conventional photolithographic techniques are utilized to provide a single opening 26 in the oxide layer 23 to expose the semiconductor body or substrate 21 below the oxide. Thereafter, a diffusion step is carried out in which an impurity is diffused through the window 26 to form a channel region 27 of a second conductivity type or, in other words, opposite to that of the semiconductor body 21 and which forms a P-N junction 28 which is substantially dish-shaped and which extends to the surface 22 in a region underlying the oxide insulating layer 23. By way of example, if the semiconductor body 21 is of N-type material, P-type impurities are diffused through the window 26 to form the P-type region 27.

It is important that during this step the diffusion be carried out in a non-oxidizing atmosphere so that no oxide is regrown in the window 26. Typical atmospheres for carrying out such a diffusion without growing oxide could be nitrogen or Argon. This makes it possible to use the same window 26 for the next diffusion step explained.

The impurity concentration for the P-type diffusion typically would have a surface concentration of $10^{20}$ impurities per cubic centimeter and a typical junction depth at this stage ranging from between 1 – 4 microns. The diffusion temperature would be in the range (1,050°C. - 1150°C.) with the diffusion time ranging from 10 minutes to 2 or 3 hours depending upon the final channel length and the final channel impurity profile required. Basically, the control of the channel length in this device is very similar to that of controlling the base width of a transistor. As is well known to those skilled in the art, the base width of a transistor can be controlled very accurately in the range of a few tenths of a micron up to 5 to 6 microns.

Thereafter, as shown in FIG. 3, an additional opening 31 is formed in the oxide layer 23 for the drain. Another diffusion step is then carried out using an impurity of the type opposite used for the first diffusion step shown in FIG. 2. Typically, this can be an N+ impurity such as a phosphorus compound to provide a source region 32 within the channel region 27 and which forms a P-N junction 33 which is also dish-shaped and within the junction 28 and extends to the surface underneath the oxide insulating layer 23 to provide a channel 34 of a precise length. An additional N+ region 36 is formed through the window 31 to make good contact to the drain region.

The diffusion step which is carried out in FIG. 3 can be carried out in either an oxidizing or a non-oxidizing atmosphere. However, it has been found that it is preferable to carry it out in an oxidizing atmosphere. If this is the case, a thin oxide layer 23*a* grows in the windows 26 and 31.

Somewhat similar method steps are set forth in copending application Ser. No. 776,069, filed on Nov. 15, 1968 now U.S. Pat. No. 3,600,642, assigned to the same assignee.

It can be seen that the diffusion in which the source region 32 is formed is carried out through the same oxide opening or window 26 as was the original channel diffusion. By relying on the lateral or side diffusion under the oxide layer 23 as illustrated in FIGS. 2 and 3, it is possible to precisely control the lateral dimension (marked as L in FIG. 3) of the channel 34 on the surface 22 of the semiconductor body 21. Typical channel lengths which can be fabricated in accordance with the present process range from 0.3 microns up to 5 microns.

As soon as the steps shown in FIG. 3 have been completed, all of the oxide layer 23 is stripped off the surface 22 in a conventional manner so that the surface 22 is exposed. Thereafter, a thick oxide layer 38 is regrown on the surface 22 having a suitable thickness such as 3,000 Angstroms but which can range in thickness from 8,000 Angstroms to 1½ microns. In order to prevent disturbing the diffusion fronts which have been formed within the semiconductor body 21, it is preferable that the thick oxide layer 38 be deposited at a relatively low temperature as, for example, a temperature below 500°C. This prevents disturbing the precise channel geometry which previously has been fabricated within the semiconductor body 21. Typically, the thick insulating layer 38 can be in the form of an oxide which is deposited from a silane oxygen source in a manner well known to those skilled in the art of making MOS devices. The insulating layer 38 should be of substantial thickness, preferably greater than 1 micron, in order to ensure a drain voltage capability greater than 500 volts as hereinafter explained.

As soon as the thick oxide layer 38 has been grown, suitable photolithographic techniques are utilized to etch windows 41 in the thick oxide extending down to the surface 22 and exposing the portion of the channel 34 extending to the surface 22. As soon as this has been completed, a thin layer 38a of a suitable insulating material, such as an oxide, is deposited in the windows 41 to a precise depth and covers the channels 34 as shown in FIG. 6. Again, for reasons pointed out above, it is desirable to deposit this oxide at a relatively low temperature as, for example, below 500°C. and to a relatively precise depth ranging from 900 to 1,300 Angstroms as, for example, a depth of 1,000 Angstroms. As explained above, the oxide can be deposited from a silane oxygen source.

After the low temperature oxide has been grown to form the thin layers 38*a*, by suitable photolithographic techniques, windows 43 and 44 are formed in which the window 43 overlies the source region 32 and the window 44 exposes the N+ contact region 36 in the drain region.

Metallization 45 in the form of a thin layer of a suitable metal such as aluminum is deposited over the surface of the insulating layer 38 and into the windows 43 and 44. Thereafter, by suitable photolithographic techniques, the undesired portions of the metallization 45 are removed. Thus, there remains source metallization 46 which makes contact to the source through the window or opening 43 and drain metallization 47 which makes contact to the drain through the window or opening 43. There also remains gate metallization 48 which covers the thin oxide 38*a* overlying the channel 34. The gate metallization 48 includes a contact pad portion 48*a* shown particularly in FIG. 8. The drain metallization 47 is substantially circular with the exception that it is split to provide an opening 51 to accommodate the gate metallization 48. The drain metallization 47 is also provided with a contact portion 47*a* which overlies the thick oxide layer 38. Additional metallization 52 is formed on the insulating layer 38 and extends from the gate metallization to the drain metallization 47 so that it substantially covers the depletion region which extends outwardly from the channel 34 into the drain region. The general outline of the outer margin of the depletion region is indicated by the broken line 54 in FIG. 7. As can be seen, the additional metallization 52 is in contact with and is integral with the gate metallization 47.

The structure described above provides an MOS device which has a channel region with a greater concentration of impurities than the drain region. Thus, for applied $V_{SD}$, most of the spreading of the depletion region 54 is in the drain region away from the drain junction 28. The use of the gate metallization which extends over the drain region as far as the depletion region ensures that very high $V_{SD}$ voltages can be utilized in a semiconductor device as explained in copending application Ser. No. 791,665, filed on Jan. 16, 1969 now abandoned in favor of streamlined application filed Feb. 1, 1971, Ser. No. 11,704, and assigned to the same assignee.

By relying on side diffusion to control the channel length, extremely narrow precision channels can be achieved. Devices can readily be made with channel lengths ranging from 0.8 to 3.3 microns in <111> and <100> N-type silicon. By way of example, a device constructed in the manner set forth above had a channel length of approximately 1.4 microns. It had a $V_{SD}$ max of greater than 200 volts and had a $g_m$ greater than 10,000 $\mu$ mhos. Transconductance is very high since the Z/L ratios for the very narrow channels become very large where $z$ = channel periphery and where $L$ = the channel length. The devices were depletion mode devices and for $V_g = 0$, $I_d$ was approximately equal to 30 – 4 milliamperes. A gate voltage of approximately −6 to −11 volts completely turned the devices off.

By way of further example, breakdown voltages in the region of 100 volts to 300 volts were obtained with metal overlays overlying the depletion region of not greater than 30 microns in width. Because of the very narrow channels which can be utilized, it is possible to obtain extremely high transconductance values typically ranging from 10,000 to 20,000 $\mu$ mhos. Because of the narrow channel and the high transconductance, the frequency of operation can be fairly high. Thus, it is possible to readily operate such devices above 1 GHz.

The gate metallization with the integral field plate metallization serves two function. First, it serves to control the channel conductance and, in addition, it acts as a field plate in much the same manner as described in copending application Ser. No. 791,665, filed Jan. 16, 1969 to cause the depletion region to be spread over a large area to reduce the surface electric field so that breakdown will occur in the semiconductor body and not at the surface. The gate metallization and the field plate metallization can be separated from each other as hereinafter described. However, it is desirable that these two metallizations be relatively close because the depletion region commences with the drain junction and extends outwardly therefrom into the drain region.

Figure 9:
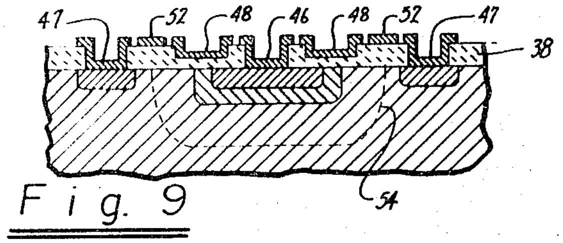
FIG. 9 is a partial cross-sectional view of another embodiment of a transistor incorporating the present invention in which the gate metallization and field plate metallization are separate.
Figure 10:
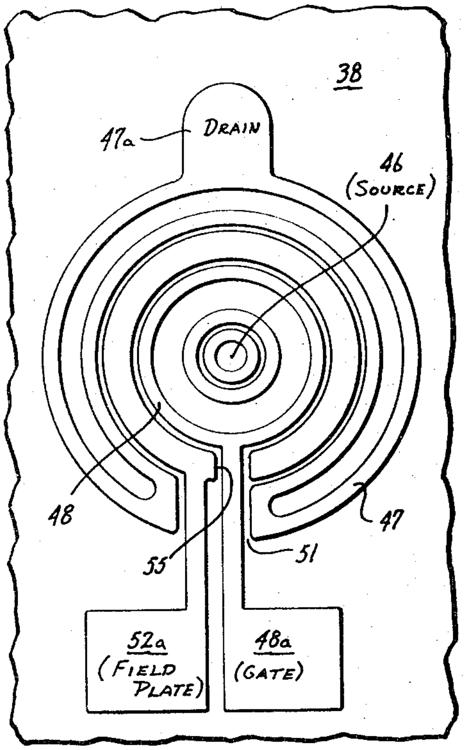
FIG. 10 is a partial top plan view of the construction shown in FIG. 9.

As hereinbefore explained, the integral gate metallization 48 and the field plate metallization 52 serve to provide control for the channel conductance and drain breakdown voltage. If desired, as shown in FIGS. 9 and 10, this integral metallization can be separated into a separate gate metallization 48 and a field plate metallization 52. The metallization 52 is shown as circular in FIG. 10 and extends through the space 51 provided in the drain metallization 47 and terminates in a contact portion 52*a*. A passage 55 is provided in the metallization 52 to accommodate the gate metallization. As can be seen, the field plate metallization 52 generally extends over the drain region to cover the depletion region associated with the drain junction.

By separating the field plate metallization and the gate metallization, it is possible to control the channel characteristics of the device separate from the breakdown voltage for the device. This may be particularly advantageous at high frequencies because this would eliminate any substantial effect which the field plate metallization would have on the feedback capacitance of the device.

The structure which is shown in FIGS. 9 and 10 can still be further improved by providing gate and field plate metallizations which are essentially continuous, yet separately contactable. This can be readily accomplished by utilizing two-layer metallization in which the two layers of metal are separated by a low temperature insulating material as, for example, a low temperature oxide which is deposited over one layer of metallization (the gate) and before the second layer (the field plate) is deposired on the structure.

The separation of the field plate from the gate metallization is desirable whenever it is necessary to reduce the feedback from the drain to the gate as low as possible. Also, by separation of the field plate from the gate metallization, it is possible to independently bias the field plate. Thus, for example, it can be connected directly to the source. If the source is grounded, the field plate will be at ground potential for high voltage purposes. In such a case, the feedback from the drain back to the gate will be considerably reduced because the field plate at ground potential will eliminate most of the feedback. For that reason, the device will be very stable with a small feedback and should have extreme usefulness in many ultrahigh frequency applications.

Figure 11:
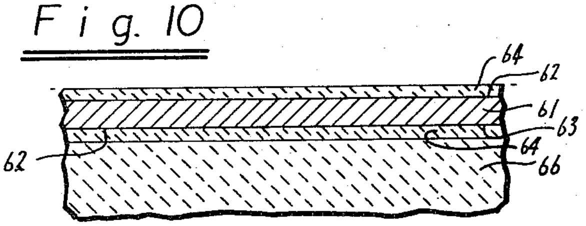
FIG. 11 is a partial cross-sectional view showing the starting material consisting of silicon on oxide for still another embodiment of the present invention.
Figure 12:
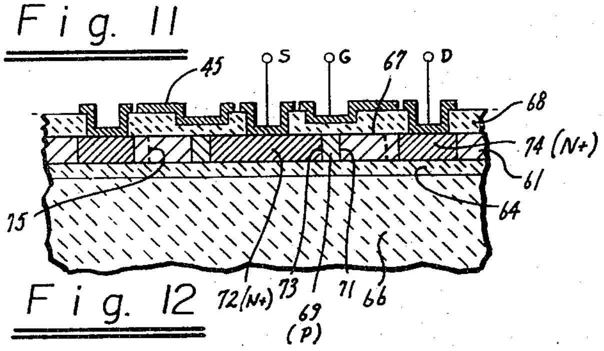
FIG. 12 is a partial cross-sectional view showing the construction of another embodiment of a transistor incorporating the present invention utilizing the starting material shown in FIG. 11.

Another embodiment of the invention is shown in FIGS. 11 and 12 in which a different starting material is utilized. As shown in FIG. 11, this starting structure is typically characterized as SOO (silicon on oxide). Thus, there is provided a single crystal silicon body 61 which has upper and lower planar surfaces 62 and 63 which are covered with silicon oxide layers 64. A support body 66 of a suitable material such as polycrystalline silicon is deposited upon one of the oxide layers 64. The other oxide layer 64 and a portion of the body 61 are removed by suitable means such as lapping to provide a thin layer of single crystal silicon of a desired conductivity type as shown in FIG. 12. Typically, this layer 61 can have a thickness ranging from 1 micron up to 5 microns. The layer 61 is provided with a planar surface 67 which has deposited thereon a layer 68 of suitable insulating material such as silicon dioxide. This layer 68 corresponds to the layer 23 shown in FIG. 1. The fabrication of the device incorporating the present invention is substantially identical to that hereinbefore described in conjunction with FIGS. 2 – 7. The principal difference is that the channel and source regions are diffused all the way to the oxide layer 64. Thus, there is provided a channel region 69 which forms a P-N junction 71 which is substantially vertical with respect to the surface 67. Similarly, there is provided a source region 72 which forms a P-N junction 73 which is also substantially vertical with respect to the surface 67. Contact regions 74 for the drain are also formed at the same time that the source regions 72 are formed. Metallization 45 identical to that described for FIG. 7 is thereafter provided to make contact with the source, gate and drain regions.

The construction which is shown in FIGS. 11 and 12 is particularly advantageous because it eliminates substantially all of the P-N junction capacitance to thereby minimize this contribution to the feedback capacitance of the device. The depletion region is indicated by the broken line 75. It can be seen that the depletion spreading is entirely lateral under the gate and field plate metallization. This causes most of the current flow to be in a lateral direction so that the carriers leaving the channel region will be swept immediately through the depletion region to the drain junction.

Figure 13:
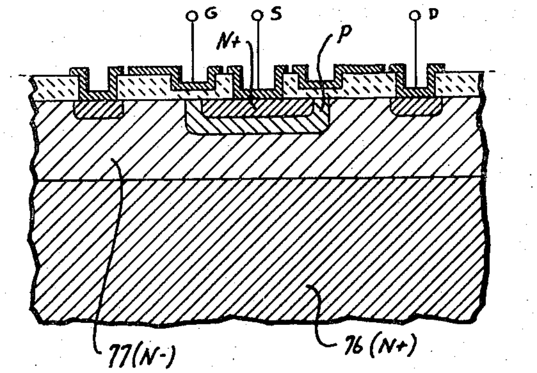
FIG. 13 is a partial cross-sectional view of still another embodiment of a transistor incorporating the present invention utilizing an epitaxial construction.
Figure 14:
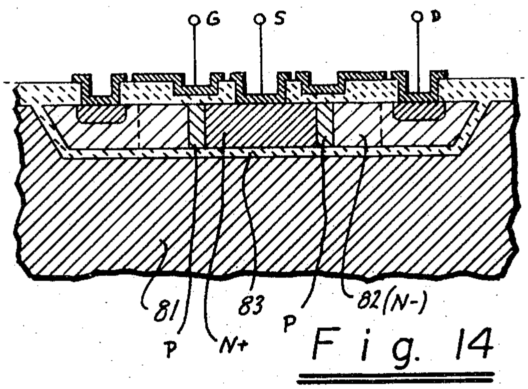
FIG. 14 is a partial cross-sectional view of still another embodiment of a transistor incorporating the present invention utilizing dielectric isolation.
Figure 16:
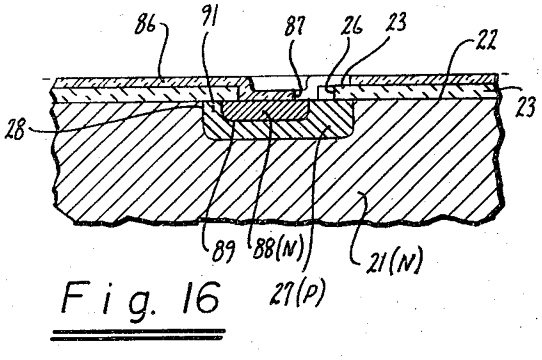
FIG. 16 is a cross-sectional view taken along the line 16—16 of FIG. 15.

Two additional constructions are shown in FIGS. 13 and 14 which show that the construction of the present invention can be utilized in conjunction with an epitaxial layer as shown in FIG. 13 and in conjunction with dielectric isolation as shown in FIG. 14. Thus, in FIG. 13, typically there is provided a semiconductor body 76 of one conductivity type as, for example, an N+ conductivity type upon which there has been deposited an epitaxial layer 77 of a suitable conductivity such as N− by a technique well known to those skilled in the art. Thereafter, the devices can be fabricated in the layer 71 in a manner substantially identical to that described in conjunction with FIGS. 1 – 7.

In FIG. 14, a support body 81 of a suitable material such as polycrystalline material is provided and which carries a plurality of islands 82 of a suitable semiconductor material such as silicon having an N− conductivity. These islands are isolated from each other and from the support structure by a layer 83 of insulating material of a suitable type such as silicon dioxide. The formation of such dielectrically isolated islands on a support structure is disclosed in copending application Ser. No. 391,704, filed Aug. 24, 1964, assigned to the same assignee.

After a construction has been obtained in which dielectrically isolated islands have been provided, the devices hereinbefore described can be fabricated within the islands in the manner set forth in FIGS. 1 – 7 and also as set forth in conjunction with FIG. 12 in which the junctions are driven all the way to the dielectric isolating layer 83.

An additional construction is shown in FIGS. 15 through 18. In fabricating this construction, the semiconductor body 21 is taken as shown in FIG. 1 and an oxide layer 23 is deposited on the surface 22. Assuming that the body 21 is a form of N-type material, a P-type diffusion is carried out through a window 26 to provide the P-type region 27 and which forms a P-N junction 28 which is substantially dish-shaped and which extends to the surface. In conjunction with FIG. 2, the diffusion step is carried out in a non-oxidizing atmosphere such as in an atmosphere of argon or nitrogen. This ensures that the diffusion will take place without an oxide forming within the window 26. As soon as the P-type region 27 has been formed, a suitable low temperature glass which has an N-type impurity such as phosphorus therein is deposited on the oxide layer 23 and in the opening or window 26 to form a layer 86. The deposition of such a layer of low temperature glass with an impurity therein is well known to those skilled in the art and gives a fairly thin layer of glass which is adherent to the layer 23 and which becomes a subsequent diffusion source as hereinafter explained.

After the low temperature glass has been deposited, conventional photolithographic techniques are utilized to open up a window 87 in the glass to expose the surface of the semiconductor body 21 in a relatively small area which overlies the P-type region 27. As soon as this hole or opening 87 has been formed, the body 21 is placed in a furnace at an elevated temperature to drive in the phosphorus impurities from the glass into the P-type region to form an N-type region 88 which forms a P-N junction 89 that is substantially dish-shaped and extends to the surface. A precise channel 91 is formed between the P-N junctions 28 and 89 similar to those hereinafter described. The only exception is that in a small region immediately underlying the window 87, N-type impurities are not driven into the P-type region 27. Thus it can be seen that the channel length throughout substantially all of the junction periphery is obtained by side diffusion under the oxide layer with the exception of a small portion of the periphery adjacent the hole 87. Thus at the point where the phosphorus doped glass has been removed, there is no diffusion and thus there is a relatively wide channel at this point as can be seen from FIG. 16.

After the N-type diffusion has been carried out, the phosphorus glass can be removed in a conventional manner by the use of a suitable etch. Thereafter, the processing steps are similar to those in FIGS. 3–6 and are utilized to provide metallization to form the various contacts. Thus there is provided a gate metallization 93, a source of metallization 94 and drain metallization 96. In addition, there is provided metallization 97 which makes contact with what is equivalent to the "substrate" in conventional MOS transistors.

Figure 18:
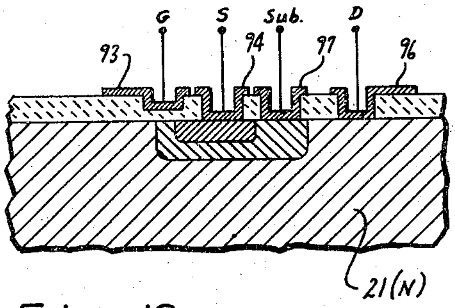
FIG. 18 is a cross-sectional view taken along the line 18—18 of FIG. 17.
Figure 15:
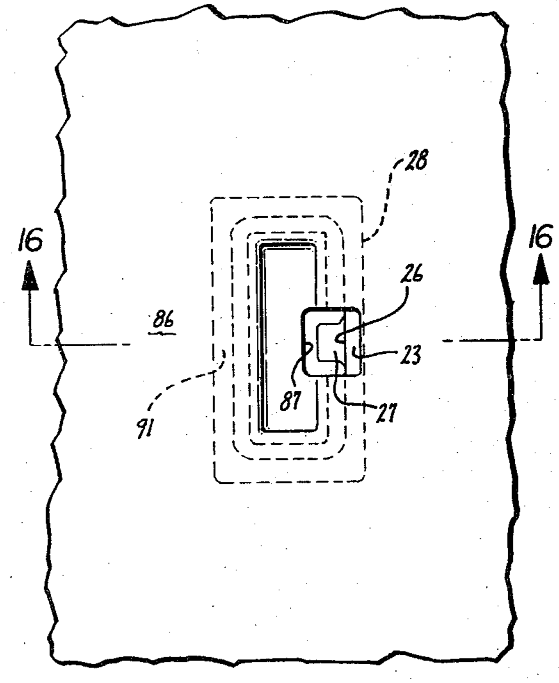
FIG. 15 is a partial top plan view showing the construction of another embodiment of a transistor incorporating the present invention.
Figure 17:
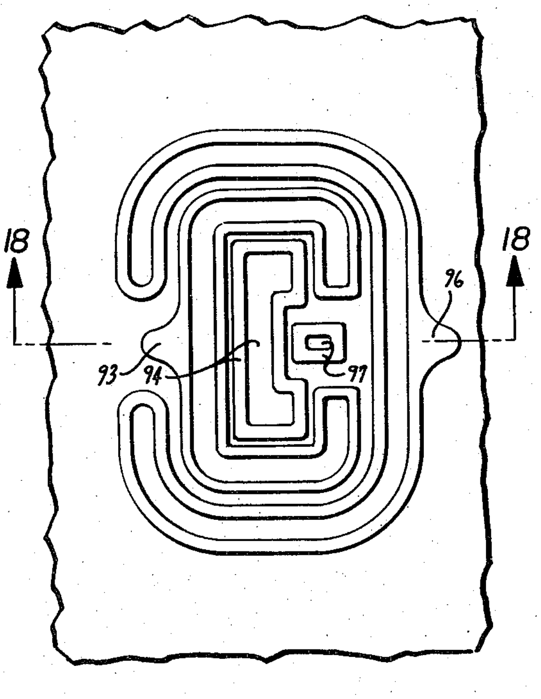
FIG. 17 is a top plan view of a completed transistor of the type as shown in FIG. 15.

It can be seen that the completed device which is shown in FIGS. 17 and 18 has a distinct advantage over the embodiments of the present invention previously hereinbefore described in that it is possible to readily make a "substrate" connection because of the relatively wide portion which is provided in the channel. In the embodiments hereinbefore described it is difficult to make such a "substrate" connection because of the relatively small channel length. Thus the embodiment of the invention shown in FIGS. 17 and 18 makes it possible to overcome these disadvantages if a "substrate" connection is to be made. It has been found that if no "substrate" connection is made that this will increase the capacitance of the device and in fact slows it down. In addition it gives the device a non-ideal DC characteristic. It has been found that the device shown in FIGS. 17 and 18 is particularly suitable for operation in the enhancement mode.

In addition to the foregoing features, the device shown in FIGS. 17 and 18 has the features of the preceding embodiments.

From the foregoing, it can be seen that the high voltage, high frequency metal insulator semiconductor device can be utilized in various types of semiconductor constructions without any difficulty. In all of the constructions, the device retains its desirable characteristics. In summary, the principal features of the device are as follows. The drain is the high resistivity region; therefore, most of the depletion width associated with the reverse biased drain junction is on the drain side. Consequently, breakdown voltage limitations are to a large extent removed from the channel geometry to the drain and by the use of the metal overlay or field plate whose length is at least as great as a maximum depletion width spreading an extremely high voltage capability obtainable. The channel is a diffused region and thus the doping concentration varies continuously across the length. The possibility of punch-through in the channel is greatly reduced because the effective resistivity in this region is greatly reduced from that of conventional MOST devices. The gate in the device performs the dual role of forming an inversion layer in the channel and also maintains a high voltage across the drain junction. The channel length can be extremely small and since the carriers leaving the inversion layer are swept immediately to the drain through the depletion region, the high frequency properties of the devices are assured.

The construction is also particularly advantageous because in all of the embodiments, the source and channel regions only require one masking step (no alignment is required) and, therefore, extremely complicated geometries can be utilized without fear of misalignment.

In all of the devices, by the use of the metal overlay serving as a field plate, it is possible to design the devices for high voltage independently of channel length while still retaining high frequency capabilities. A single gate serves the dual purpose of maintaining high voltage at the drain and controlling transistor action. By utilizing the double diffusion to obtain the channel and source regions through a single opening, it is possible to obtain depletion spreading towards the drain from the drain junction.

In addition, all of the fabrication steps required for making the device are compatible with conventional integrated circuit design.

We claim:

1. In a high voltage, high frequency metal insulator semiconductor device, a semiconductor body having a conductivity of one type and forming a substantially uniform lightly doped drain region, said semiconductor body having a substantially planar surface, a heavily doped drain contact region formed in the drain region and extending to said surface a layer of insulating material formed on said surface, a channel region formed in the semiconductor body having a conductivity opposite that of the semiconductor body to form a first P-N junction extending to the surface beneath said layer of insulating material, a source region formed within the channel region of the first named conductivity type and forming a second P-N junction extending to said surface beneath said layer of insulating material, said first and second P-N junctions extending to said surface beneath said layer of insulating material, said first and second P-N junctions defining a channel of precise length, metallization forming gate, source and drain contacts, said metallization overlying said layer of insulating material and making contact through the insulating layer with the drain contact and source regions, said metallization overlying the channel and being separated from the channel by said layer of insulating material to form the gate contact, and additional metallization formed on said layer of insulating material and extending between the metallization which provides said gate and drain contacts and in such a manner so that the additional metallization is disposed unsymmetrically with respect to the channel, said additional metallization extending over a drift region formed in the uniformly lightly doped region between the channel and the heavily doped contact region.

2. A device as in claim 1 wherein said first named metallization and the additional metallization are isolated from each other by said layer of insulating material.

3. A device as in claim 1 wherein the metallization which forms the gate contact and the additional metallization are interconnected.

4. A device as in claim 3 wherein the metallization forming the gate contact and the additional metallization are formed integrally.

5. A device as in claim 1 wherein said first and second P-N junctions are substantially dish-shaped.

6. A device as in claim 1 wherein said semiconductor body is in the form of a thin layer together with a support structure formed of an insulator carrying said thin layer and wherein said first and second P-N junctions extend completely through the thin layer to the support body.

7. A device as in claim 1 wherein said semiconductor body is in the form of an epitaxial layer together with a support body formed of a semiconductor material carrying said epitaxial layer.

8. A device as in claim 1 wherein said semiconductor body is in the form of an island of semiconductor material together with a support body and means for dielectrically isolating the island of semiconductor material from the support body and from any other islands carried by the support body.

9. A device as in claim 1 wherein the layer of insulating material overlying the channel is relatively thin and wherein the remainder of the layer of insulating material is relatively thick.

10. A device as in claim 1 wherein said metallization also forms a contact making contact to said channel region.

11. A device as in claim 10 wherein said channel has the length which is substantially greater at one portion of the surface of the semiconductor body to facilitate making the contact to the channel region.

12. In a high voltage, high frequency metal insulator semiconductor device, a semiconductor body having a conductivity of one type and forming a substantially lightly uniformly doped drain region, said semiconductor body having a substantially planar surface, a heavily doped drain contact region formed in the drain region and extending to said surface a layer of insulating material formed on said surface, a channel region formed in the semiconductor body and having a conductivity opposite that of the semiconductor body to form a first P-N junction extending to the surface beneath said layer of insulating material, a source region formed within the channel region of the first named conductivity type and forming a second P-N junction extending to said surface beneath said layer of insulating material, said first and second P-N junctions defining a channel of precise length, source and drain metallization formed on said layer of insulating material and extending through said layer of insulating material and making contact with the drain contact and source region, gate metallization separate from said source and drain metallization and overlying said insulating layer in the region of the channel, said gate metallization being formed uniformly so that it is unsymmetrical with respect to the channel and extends over a drift region formed in the lightly doped drain region between the channel and the heavily doped drain contact region whereby the depletion region spreads into the drift region to make it possible for the device to withstand high voltages.

* * * * *